(12) United States Patent
Lim et al.

(10) Patent No.: US 9,097,515 B2
(45) Date of Patent: Aug. 4, 2015

(54) MEASURING DEVICE AND MEASURING METHOD

(71) Applicant: Samsung Electronics Co., Ltd., Gyeonngi-do (KR)

(72) Inventors: Heonyoung Lim, Seoul (KR); KwangJun Park, Gyeonggi-do (KR); Seung-Joon Lee, Gyeonggi-do (KR); Hoonsik Cho, Gyeonggi-do (KR); Kyungsoo Oh, Incheon (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 13/954,443

(22) Filed: Jul. 30, 2013

(65) Prior Publication Data

US 2014/0036275 A1    Feb. 6, 2014

(30) Foreign Application Priority Data

Aug. 2, 2012   (KR) .......................... 10-2012-0084939

(51) Int. Cl.
*G01B 11/14* (2006.01)
*G01B 11/00* (2006.01)
*H01L 21/677* (2006.01)

(52) U.S. Cl.
CPC .............. *G01B 11/14* (2013.01); *G01B 11/002* (2013.01); *H01L 21/677* (2013.01)

(58) Field of Classification Search
CPC ..... H01L 21/677; G01B 11/002; G01B 11/14
See application file for complete search history.

(56) References Cited

U.S. PATENT DOCUMENTS

| 5,914,929 | A * | 6/1999 | Kato et al. .................... 720/656 |
| 6,781,205 | B1 | 8/2004 | Levit et al. |
| 8,245,389 | B2 | 8/2012 | Hirano et al. |
| 2005/0179709 | A1* | 8/2005 | Salisbury et al. ................. 347/4 |
| 2007/0269297 | A1* | 11/2007 | Meulen et al. ........... 414/222.01 |
| 2008/0006762 | A1* | 1/2008 | Fadell et al. ............... 250/201.1 |
| 2008/0072444 | A1* | 3/2008 | Harrill et al. .................... 33/600 |
| 2012/0022827 | A1 | 1/2012 | Hertgens et al. |

FOREIGN PATENT DOCUMENTS

| JP | 2001-210699 | 8/2001 |
| JP | 2002-071335 | 3/2002 |
| JP | 2011-096843 | 5/2011 |
| JP | 2011-210699 | 10/2011 |

(Continued)

*Primary Examiner* — Kara E Geisel
*Assistant Examiner* — Maurice Smith
(74) *Attorney, Agent, or Firm* — Myers Bigel Sibley & Sajovec, PA

(57) ABSTRACT

A measuring device may include a housing having an opening where a substrate is carried in; a first sensor including a first light output part emitting first light to the substrate and a first light receiving part sensing the first light reflected from the substrate; a second sensor including a second light output part emitting second light and a second light receiving part sensing the second light, wherein the second light is blocked out by the substrate being carried in the housing; and a controller calculating a vertical displacement of the substrate using the fact that the first light is reflected, calculating a horizontal displacement of the substrate using the fact that the second light is blocked out, and calculating a displacement error of the substrate carried in the housing with respect to a carry-in exact position of the substrate based on the vertical displacement and the horizontal displacement.

8 Claims, 13 Drawing Sheets

(56) References Cited

FOREIGN PATENT DOCUMENTS

| | | |
|---|---|---|
| JP | 2011-282862 | 10/2011 |
| KR | 1020070003213 | 1/2007 |
| KR | 1020100099923 | 9/2010 |
| KR | 1020110062522 | 6/2011 |
| KR | 1020120022742 | 3/2012 |

* cited by examiner

● : Point Location
• : Measured Value

MEASURING DEVICE AND MEASURING METHOD

CROSS-REFERENCE TO RELATED APPLICATIONS

This patent application claims priority under 35 U.S.C. §119 from Korean Patent Application No. 10-2012-0084939, filed on Aug. 2, 2012, the content of which is hereby incorporated by reference herein in its entirety.

FIELD

The present inventive concept relates to measuring devices and measuring methods, and more particularly, to measuring devices configured to measure the degree of precision of substrate transfer and methods of measuring the degree of precision of substrate transfer.

BACKGROUND

A semiconductor device is manufactured through various processes. For example, a wafer transfer atmospheric type robot can transfer a substrate between a front opening unified pod (FOUP) placed on a load port and chambers performing a process or between the chambers to perform the semiconductor manufacturing process.

As a transfer robot repeats a substrate transfer, due to abrasion of internal components, for example, the degree of precision of substrate transfer may be lowered and unexpected failure may occur. Since this leads to a decrease of the productivity of the whole semiconductor system or manufacturing process, the transfer robot should be repaired or replaced at the appropriate time. Thus, it is useful to predict a deteriorative life expectancy of the transfer robot in advance.

SUMMARY

Some embodiments of the inventive concept are directed to a measuring device including: a housing having an opening configured to receive a substrate that is carried in the housing along a carry-in path, the opening being disposed on one side of the housing; a first sensor disposed on an inner surface of the housing, the first sensor including a first light output part configured to emit first light to the substrate and a first light receiving part configured to sense the first light reflected from the substrate; a second sensor including at least one second light output part configured to emit second light and at least one second light receiving part configured to sense the second light, wherein the at least one second light output part and the at least one second light receiving part are disposed on opposite inner surfaces of the housing with the carry-in path of the substrate disposed between them such that the second light is blocked from the at least one second light receiving part by the substrate; and a controller. When the a substrate is carried in the housing, the controller is configured to: calculate a vertical displacement of the substrate using the the first light reflected from the substrate, calculate a horizontal displacement of the substrate using the second light blocked by the substrate, and calculate a displacement error of the substrate which is carried in the housing with respect to a predetermined desired carry-in position of the substrate, wherein the displacement error is calculated using the vertical displacement and the horizontal displacement.

Other embodiments of the inventive concept are directed to a measuring method using a measuring device including a housing having an opening, a first sensor including a first light emitter and a first light receiver which are disposed on a common inner surface of the housing, a second sensor including at least one second light emitter and at least one second light receiver which are disposed on opposing inner surfaces of the housing, and at least one controller. The measuring method comprises: emitting a second light using the at least one second light emitter and receiving the second light using the at least one second light receiver; using the at least one second light receiver, determining whether the second light emitted from the at least one second light emitter is blocked by a substrate carried in the housing by a transfer robot; using the controller, calculating a horizontal displacement of the substrate based on a signal received from the at least one second light receiver; emitting a first light to the substrate using the first light emitter and receiving the first light reflected from the substrate using the first light receiver; using the controller, calculating a vertical displacement of the substrate based on a signal received from the first light receiver; and using the controller, calculating a displacement error of the substrate which has been carried in the housing relative to a predetermined exact carry-in position of the substrate, wherein the displacement error is calculated based on the horizontal displacement and the vertical displacement.

Other embodiments of the inventive concept are directed to a method including providing a measuring device comprising: a housing having an opening configured to receive a substrate therethrough; a vertical displacement sensor system including a first light emitter and a first light receiver, the first light emitter and the first light receiver disposed on a common inner surface of the housing; a horizontal displacement sensor system including at least one second light emitter and at least one second light receiver, the at least one second light emitter and the at least one second light receiver disposed on opposite inner surfaces of the housing; and at least one controller. The method further includes: emitting a first light from the first light emitter; emitting a second light from the second light emitter and receiving the second light at the second light receiver; advancing a substrate in the housing through the opening and to a final position; using the horizontal displacement sensor system, sending a signal to the controller when the substrate is in the final position and the second light is blocked from being received at the second light receiver by the substrate; using the controller, determining a horizontal displacement error using the signal received from the horizontal displacement sensor system, wherein the horizontal displacement error is the horizontal displacement between the substrate in the final position and a substrate in a predetermined exact position; using the vertical displacement sensor system, sending a signal to the controller when the substrate is in the final position and the first light emitted from the first light emitter is reflected from the substrate and received at the first light receiver; and using the controller, determining a vertical displacement error using the signal received from the vertical displacement sensor system, wherein the vertical displacement error is the vertical displacement between the substrate in the final position and a substrate in the predetermined exact position.

DETAILED DESCRIPTION OF THE EMBODIMENTS

Figure 1:
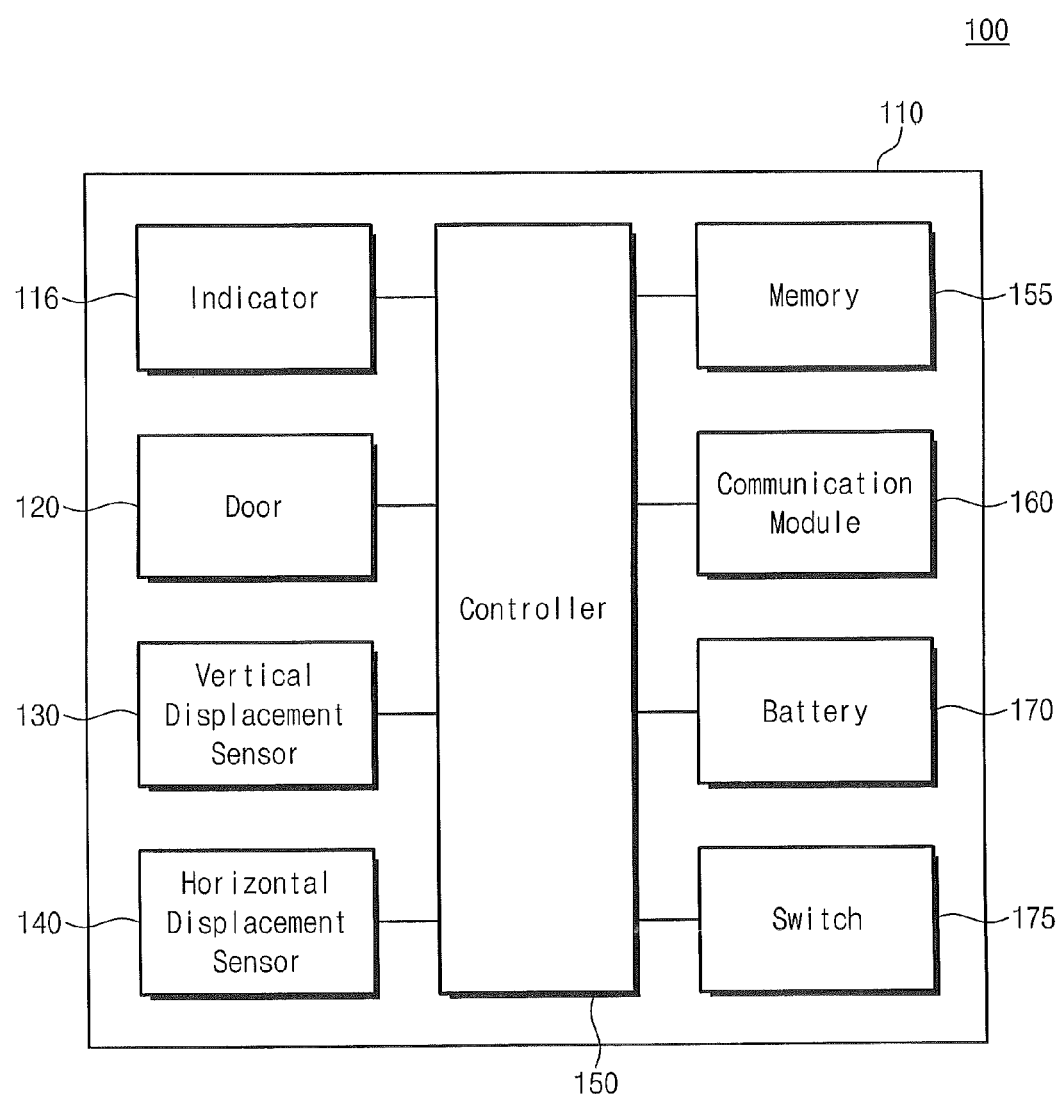
FIG. 1 is a block diagram illustrating a measuring device in accordance with some embodiments of the inventive concept.

Embodiments of the inventive concept will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under." The device may be otherwise oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only unless specifically indicated otherwise.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present invention. The sequence of operations (or steps) is not limited to the order presented in the claims or figures unless specifically indicated otherwise.

FIG. 1 is a schematic view of a measuring device 100 in accordance with some embodiments of the inventive concept.

Referring to FIG. 1, the measuring device 100 includes a housing 110, an indicator 116, a door 120, a vertical displacement sensor 130, a horizontal displacement sensor 140, a controller 150, a memory 155, a communication module 160, a battery 170 and a switch 175. The measuring device 100 does not necessarily include all the components described above. The measuring device 100 may include only some of the components described above.

Figure 2:
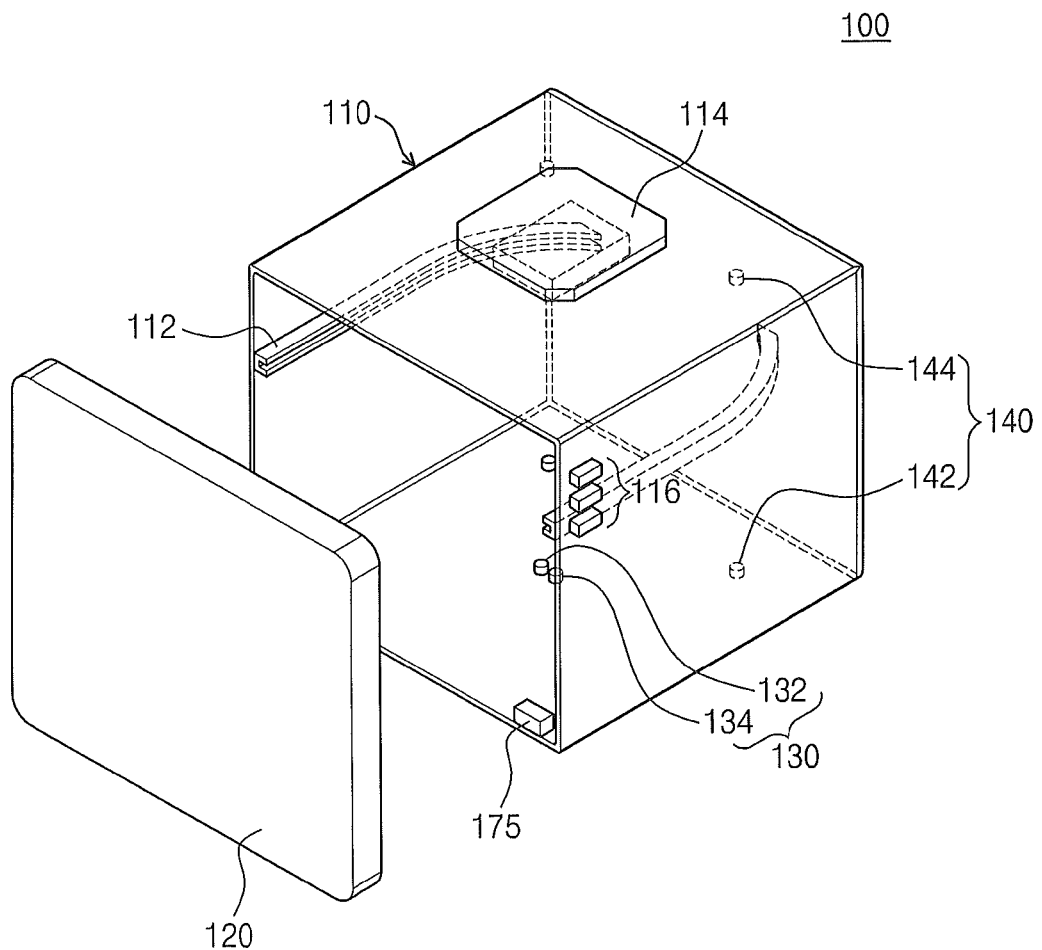
FIG. 2 is a perspective view of the measuring device of FIG. 1.
Figure 3:
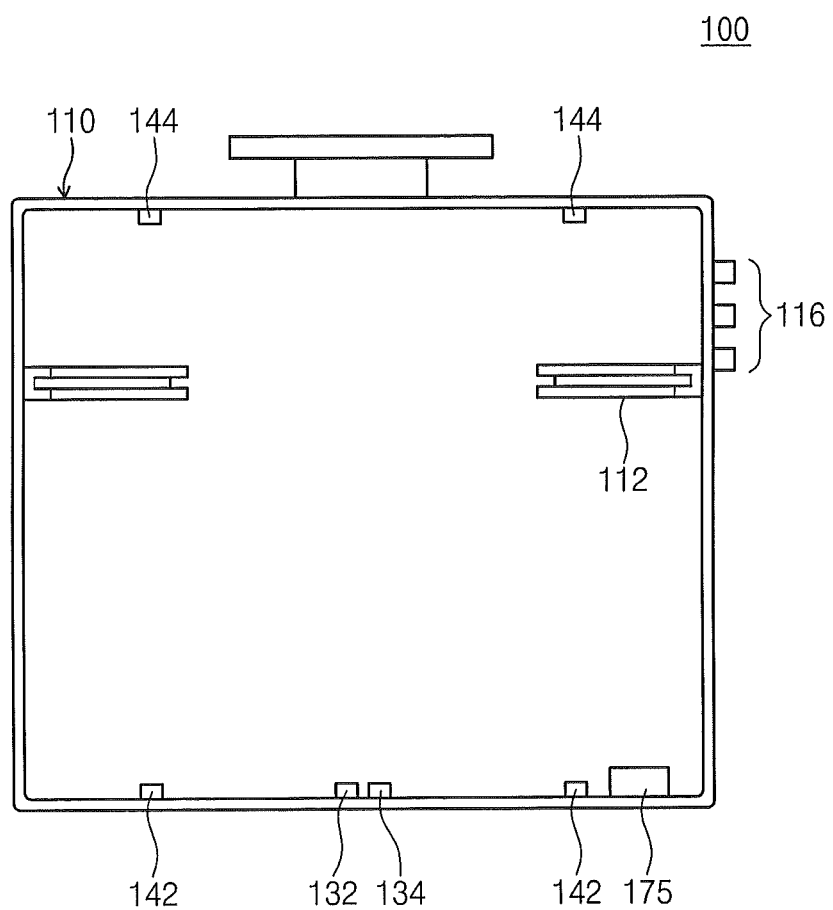
FIG. 3 is a front view of the measuring device of FIG. 1.
Figure 4:
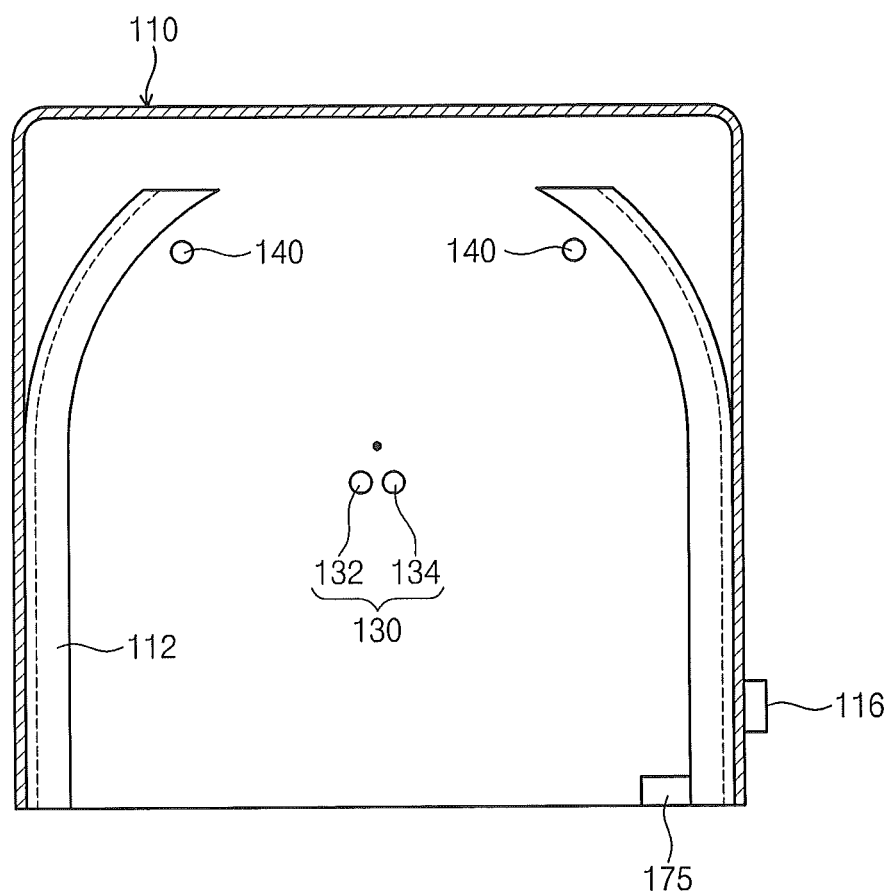
FIG. 4 is a cross sectional view of the measuring device of FIG. 1 when viewed from the top.
Figure 5:
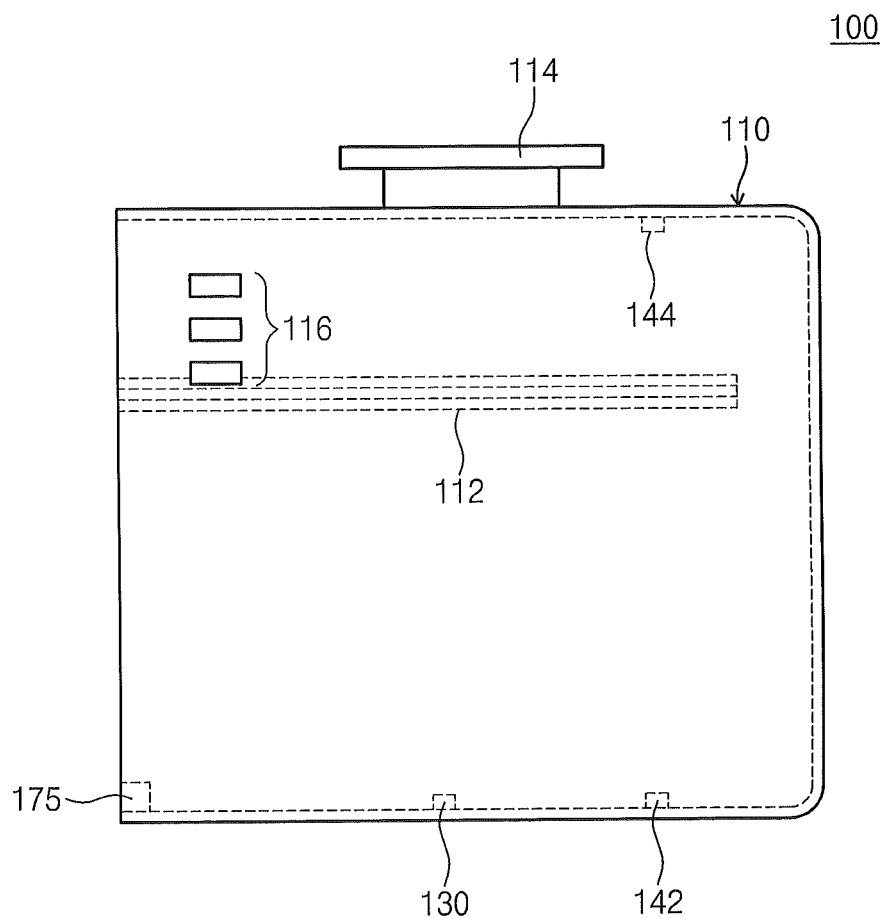
FIG. 5 is a partially transparent sectional view of the measuring device of FIG. 1 when viewed from the side.

FIG. 2 is a perspective view of the measuring device illustrated in FIG. 1. FIG. 3 is a front view of the measuring device illustrated in FIG. 1. FIG. 4 is a cross sectional view of the measuring device illustrated in FIG. 1 when viewed from the top. FIG. 5 is a cross sectional view of the measuring device illustrated in FIG. 1 when viewed from the side.

The housing 110 may constitute a body of the measuring device 100. The housing 110 may be provided in the form that is compatible with a wafer cassette called a front opening unified pod (FOUP). For example, the housing 110 may be a container having the same general shape as a FOUP, that is, a container having a hexahedral shape overall but having a shape that the rear (e.g, opposite the surface in which an opening is formed) forms a circle or an oval when viewed from the top. A holding member or handle 114 may be provided on a top surface of the housing 110. A FOUP transfer device such as an overhead transfer OHT may hold (e.g., connect to or grasp) the holding member 114 to hold the measuring device 100 (e.g., during transfer).

An opening is formed in a front surface of the housing 110. The opening may have a rectangular or square shape. Through the opening, a substrate may be carried in, loaded in or transferred into the housing 110 by a transfer robot and a substrate may be carried out of, removed from or transferred out of the housing 110 by a transfer robot.

A support member 112 may be formed or disposed on inner side surface(s) of the housing 110. The support member 112 may be provided as a bracket or slot or a bracket having a slot that is formed along at least a major portion of a depth or length of the side surfaces of the housing 110 when viewed from the top. A substrate may be located on or loaded or transferred on or into the support member 112. That is, the support member 112 is configured to hold or support a substrate transferred thereon or thereto.

To accommodate several substrates at the same time, a plurality of support members are generally provided and spaced apart from each other up and down (e.g., vertically) in a FOUP. For example, twenty five slots may be formed in the FOUP to accommodate twenty five wafers. Since the measuring device 100 may not be configured to accommodate a plurality of substrates, only one support member 112 may be disposed or formed in the housing 110. In the housing 110, one support member 112 may be formed at, for example, the seventeenth slot position from the bottom on the basis of a FOUP having twenty five slots. In some embodiments, the measuring device 100 measures the degree of precision of transfer of substrates at various heights, and therefore a plurality of support members 112 may be disposed or formed in the housing 110 (e.g., in a spaced-apart relationship).

The indicator 116 may indicate a state of the measuring device 100. For example, the indicator 116 can indicate whether or not a power supply of the measuring device 100 is turned on, whether or not the measuring device 100 is located on a load port, whether or not the door 120 of the measuring device 100 is open (or closed), a remaining capacitance of the battery 170, whether or not the battery 170 is being charged, whether or not an error is generated during an operation of the measuring device 100 and whether or not the measuring device 100 is communicating with an external device.

The indicator 116 may be installed at or on an external surface. The indicator 116 may provide visual feedback, for example, by way of indicators such as a plurality of light emitting diode LED or a display.

The door 120 opens or closes an opening of the housing 110. That is, the door 120 may be sized and configured such that the housing 110 may be opened or closed depending on the position of the door 120. The door 120 may be installed at a front surface or side of the housing 110 in which an opening of the housing 110 is formed. The door 120 may be detachable from the housing 110. That is, the door 120 can be detached from the housing 110 or can be attached or installed at the housing 110 by a transfer robot, or a door opener arranged at a load port or semiconductor equipment except the load port. Therefore, the opening can be opened or closed.

The vertical displacement sensor 130 measures a vertical displacement of a substrate which is carried in the housing 110. The vertical displacement sensor 130 may include a first light output part or first light emitter 132 configured to emit a first light and a first light receiving part or a first light receiver 134 configured to receive the first light. The first light may be a laser and the first light output part 132 may be a laser diode (LD) configured to output a laser and the first receiving part 134 may be a photodiode (PD).

The first light output part 132 may be disposed at or on an inner bottom surface of the housing 110 or at or on a top surface of the housing 110. The first light receiving part 134 may be disposed at the same inner surface of the housing 110 as that at which the first light output part 132 is disposed. That is, the first light emitter 132 and the first light receiver 134 may be disposed at or on a common inner surface of the housing 110. According to some embodiments, if the first light output part 132 outputs the first light to a substrate, the first light is reflected from the substrate and the first light receiving part 134 can receive the reflected first light.

If the first light output part 132 and the first light receiving part 134 are disposed at a bottom surface of the housing 110, the first light output part 132 can emit the first light to the substrate and the first light receiving part 134 can receive the first light reflected from the substrate. Since a top surface of the substrate may be a pattern surface and a bottom surface of the substrate may be a non-pattern surface, the first light output part 132 and the first light receiving part 134 may be disposed at a bottom surface of the housing 110 such that the first light is reflected from the bottom surface of the substrate to prevent the pattern surface from being damaged.

There is no limitation in a horizontal location of the first light output part 132 and the first light receiving part 134 (e.g., when viewed from the front of the device 110). The first light output part 132 and the first light receiving part 134 may be disposed at the center on the basis of a substrate which is carried in a carry-in exact position of the substrate, more stable measurement is possible. As used herein, the term "carry-in exact position" refers to a position in which the substrate is completely loaded in the device 100 as if the transfer robot is operating properly. This may also be referred to as a desired carry-in position. These positions are generally predetermined.

In a method of measuring a distance by reflecting light like a laser, there is a method using a time of flight of light. Since the velocity of light is constant, if a time of flight of light is known, a distance can be measured. The time of flight can be calculated from a time interval between the time when light is output and the time when the light is received or can be calculated from a phase difference between the light which was output and the received light.

The first light receiving part 134 can receive the first light to sense a phase difference between the received first light and the outputted first light. If the time of flight is calculated from the phase difference and a moving distance of light is obtained from the time of flight, a vertical displacement of the substrate can be calculated.

The horizontal displacement sensor 140 measures a horizontal displacement of the substrate which is carried in the housing 110. The horizontal displacement sensor 140 may include at least one second light output part or second light emitter 142 configured to emit a second light and at least one second light receiving part or second light receiver 144 configured to receive the second light. For example, the second light may be a laser, and the second light output part 142 may be a laser diode configured to output a laser and the second light receiving part 144 may be a photodiode.

The second light output part 142 and the second light receiving part 144 may be disposed at or on opposing inner surfaces of the housing 110 with a carry-in or transfer path of the substrate between them. That is, the second light output part 142 may be disposed at or on one of an inner bottom surface and an inner top surface of the housing 110. The second light receiving part 144 may be disposed at or on the other one of the inner bottom surface and the inner top surface of the housing 110. In this regard, the substrate may pass between the second light output part 142 and the second light receiving part 144 while being carried in or transferred into the housing 110.

As illustrated, the second light output part 142 may be disposed on a bottom surface of the housing 110 and the second light receiving part 144 may be disposed on a top surface of the housing 110. When a substrate is not carried in (e.g., or not fully carried in) the housing 110, the second light output part 142 can output the second light and the second light receiving part 144 can receive the second light. When a substrate is carried in the housing 110 to pass a place in which the horizontal displacement sensor 140 is disposed when viewed from the top, the outputted second light is blocked (out) by the substrate such that the second light receiving part 144 does not receive the second light. Thus, the horizontal displacement sensor 140 can determine or sense whether or not the substrate has passed a place or position in which the horizontal displacement sensor 140 is disposed according to whether or not the second light receiving part 144 receives the second light.

A horizontal displacement of the substrate that is carried in or transferred into the housing 110 can be calculated from a distance that the substrate moves from the time when the substrate passes a place in which the horizontal displacement sensor 140 is disposed (e.g., when the second light is blocked) to the time when carry-in of the substrate is completed (e.g., the substrate is in a "final position"). If the substrate is carried in the housing 110 at a constant speed, a moving distance of the substrate can be calculated based on a moving time of the substrate. The time that the substrate moves may be a time interval between the time when the substrate passes the horizontal displacement sensor 140 and the time when carry-in of the substrate is completed. The time when the substrate passes the horizontal displacement sensor 140 is the time when light being received at the second light receiving part 144 is blocked out. The time when carry-in of the substrate is completed is the time when the movement of the substrate is stopped. The time when the movement of the substrate is stopped may be the time when displacement components remains constant and it may be determined by the time when a vertical displacement value being measured in the vertical displacement sensor 130 remains constant (e.g., this may be the time when carry-in of the substrate is completed). Thus, a horizontal displacement of the substrate can be calculated using the horizontal displacement sensor 140.

The second light output part 142 and the second light receiving part 144 may be disposed at an edge of the substrate when the substrate is carried in a desired or exact carry-in position when viewed from the top. That is, the second light emitter 142 and the second light receiver 144 may be directed toward an edge of the substrate when the substrate is in the desired or exact carry-in position. As described above, since a horizontal displacement of the substrate is calculated from a distance that the substrate moves after passing the second light, if the distance that the substrate moves after passing the second light is too large, an error may occur and thereby an accurate horizontal displacement may be difficult or impossible to determine. Thus, if the second light output part 142 and the second light receiving part 144 are disposed at an edge of the substrate of which carry-in is completed, as a distance that the substrate being carried in the housing 110 moves through the second light is comparatively short, an error of horizontal component may be reduced.

The horizontal displacement sensor 140 may include a plurality of second light output parts or second light emitters 142 and a plurality of second light receiving parts or second light receivers 144. Since the horizontal displacement includes the same direction components as the carry-in direction of the substrate and direction components perpendicular to the carry-in direction of the substrate, at least two second light output parts 142 and at least two second light receiving parts 144 may be provided to determine a horizontal displacement.

The plurality of second light output parts 142 may be disposed on a bottom surface of the housing 110 while forming a predetermined angle at the same distance from the center of the substrate of which carry in is completed when viewed from the top. The plurality of second light receiving parts 144 may be disposed on a top surface of the housing 110 of places corresponding to the plurality of second light output parts 142 respectively when viewed from the top. That is, corresponding second light output parts and second light receiving parts 142, 144 may be aligned. Each of the second light output parts 142 may be disposed substantially equidistant or equidistant from a center of a substrate that has been carried in the housing in the predetermined desired carry-in position. Similarly, each of the second light receiving parts 144 may be disposed substantially equidistant or equidistant from a center of a substrate that has been carried in the housing in the predetermined desired carry-in position. Thus, while the substrate is carried in the housing 110, a first blocking time that one second light receiving part 144 senses a block-out of the second light and a second blocking time that another second light receiving part 144 senses a block-out of the second light can be obtained. A two-dimensional horizontal displacement value can be calculated using the first blocking time and the second blocking time.

The controller 150 may control and monitor various components of the measuring device 100. For example, the controller 150 can calculate a displacement error of the substrate of which carry-in is completed using a sensing result or a measuring signal or value of the horizontal displacement sensor 140 and the vertical displacement sensor 130.

The controller 150 may be embodied as a computer or a similar device using software, hardware or combination thereof. The controller 150 in hardware may be provided as an application specific integrated circuits (ASICs), a digital signal processors (DSPs), a digital signal processing devices (DSPDs), a programmable logic devices (PLDs), a field programmable gate arrays (FPGAs), a processor, a micro-controller, a microprocessor and an electrical device for performing a control function which is apparent to those skilled in the art. The controller 150 software can be embodied by a software code or a software application written in one or more program languages.

The memory 155 can be configured to store data or information. The memory 155 can store displacement error value(s) calculated by the controller 150.

The memory 155 may include various storage mediums. The memory 155 may include a flash memory, a RAM, a ROM, a hard disk, a SD card, an optical disk such as a CD or a blue ray disk and various other storage mediums.

The communication module 160 can be configured to communicate with external or outside equipment. The communication module 160 can transmit displacement error value(s) stored in the memory 155 to the external equipment.

The communication module 160 can perform a communication in various embodiments through a wired connection and a wireless network. The communication module 160 can communicate via a wired connection such as a universal serial bus (USB) and RS-232. The communication module 160 can perform a wireless communication such as Wi-Fi, Wibro, Bluetooth, Zigbee, RFID, and infrared communication, for example. The manner in which the communication module 160 communicates is not limited thereto and may include various methods of transmitting/receiving information to/from external equipment.

The battery 170 can provide a power to various components of the measuring device 100. The battery 170 can provide power to at least some of the vertical displacement sensor 130, the horizontal displacement sensor 140, the controller 150, the indicator 116, the memory 155 and the communication module 160.

The switch 175 can generate a signal for controlling whether to supply a power of the battery 170 or not. In some embodiments, using the signal, a power of the battery 170 is supplied while the measuring device 100 performs measurement and is not supplied while the measuring device 100 does not perform measurement. Thus, power of the battery 170 can be conserved.

The switch 175 may sense whether the door 120 is attached to the housing 110 (or closed) or whether the door 120 is detached from the housing 110 (or open). According to a sensing result or signal of the switch 175, the battery 170 may supply or may not supply power to other components of the measuring device 100. If the door 120 is open or detached from the housing 110 and thereby the housing 110 is opened, the switch 175 can detect or sense that the housing 110 is open and the battery 170 can supply a power according to a sensing result or signal of the switch 175. If the door 120 is attached to the housing 110, the switch 175 can detect or sense that the housing 110 is closed and the battery 175 may stop a supply of power according to a sensing result or signal of the switch 175.

The switch 175 may be installed on a bottom surface of the housing 110. The switch 175 may detect or sense whether or not the housing 110 is located on a load port. In the case that the housing 110 is located on the load port, the battery 170 may supply a power and in the case that the housing 110 is not located on the load port, the battery 170 may stop a supply of power.

Figure 6:
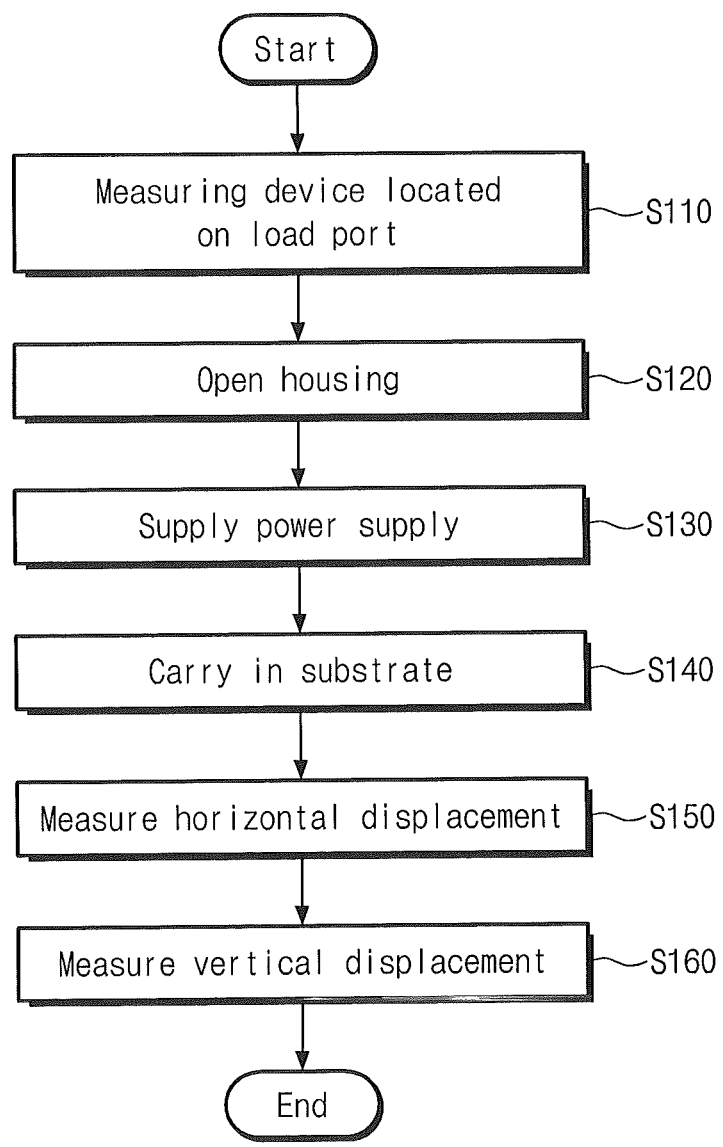
FIG. 6 is a flow chart of a measuring method in accordance with some embodiments of the inventive concept.

FIG. 6 is a flow chart of a measuring method in accordance with some embodiments of the inventive concept.

Referring to FIG. 6, a measuring method according to some embodiments includes a step S110 that the measuring device 100 is located on a load port, a step S120 that the housing 110 is open, a step S130 of supplying a power, a step S140 that a substrate is carried in the housing 110, a step S150 of measuring a horizontal displacement and a step S160 of measuring a vertical displacement.

Figure 7:
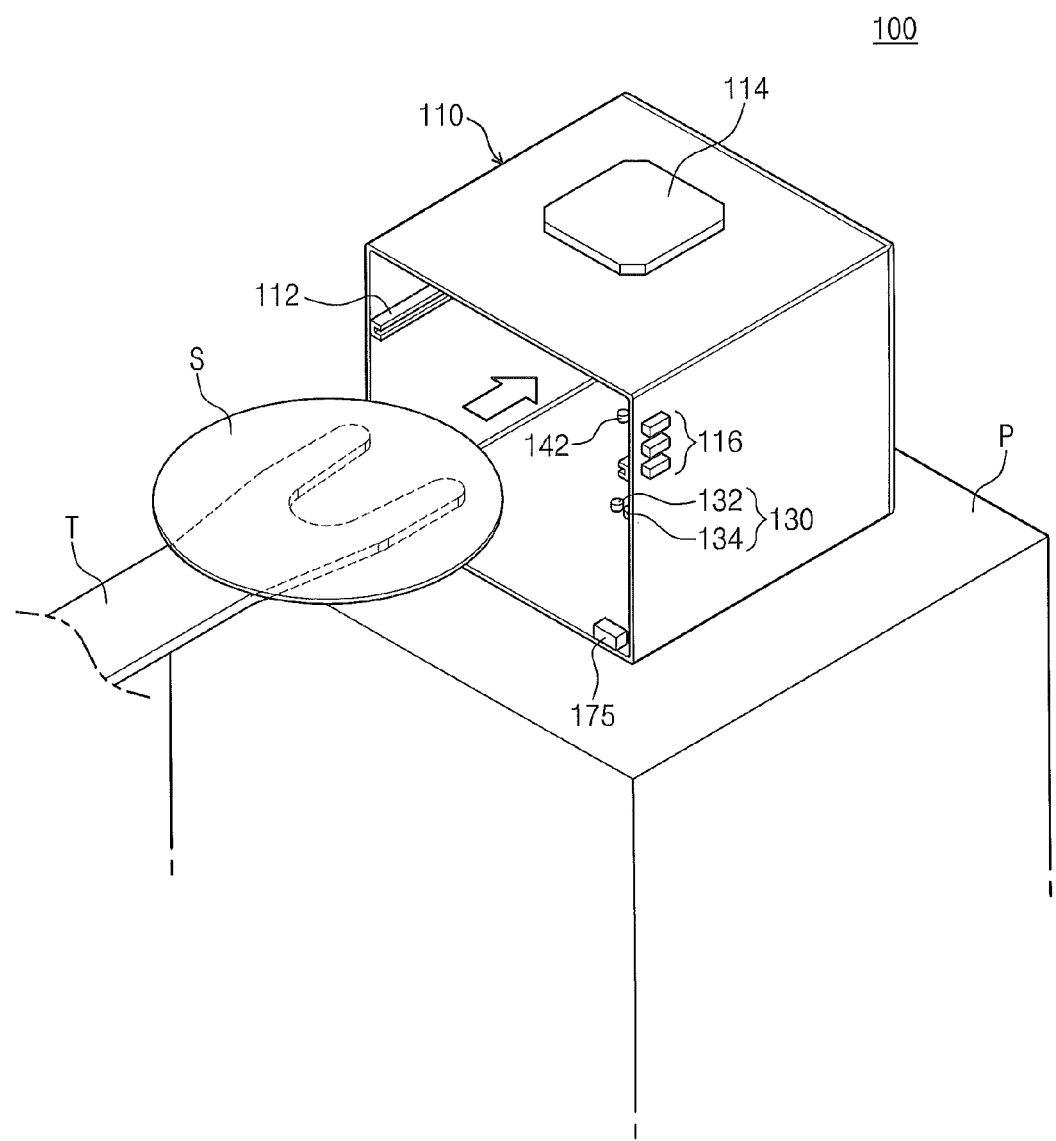
FIG. 7 is a perspective view illustrating an exemplary measuring environment in accordance with the measuring method of FIG. 6.

FIG. 7 is a drawing illustrating a measuring environment in accordance with the measuring method of FIG. 6.

The measuring device 100 may be located on a load port P by a transfer device like an overhead transfer device or a worker (Block S110 in FIG. 6). Once the measuring device 100 is located on the load port, a door opener (e.g., a robot or a worker) can detach the door 120 from the housing 110 and the housing 110 can be opened (Block S120).

The switch 175 may sense whether the measuring device 100 is either located on the load port P or whether the door 120 is detached or both and may supply a power to various components (Block S130). If power is supplied, the indicator 116 can output a sign or visual indicator indicating that the power supply is turned on/off or that the power supply is being operated.

Figure 8:
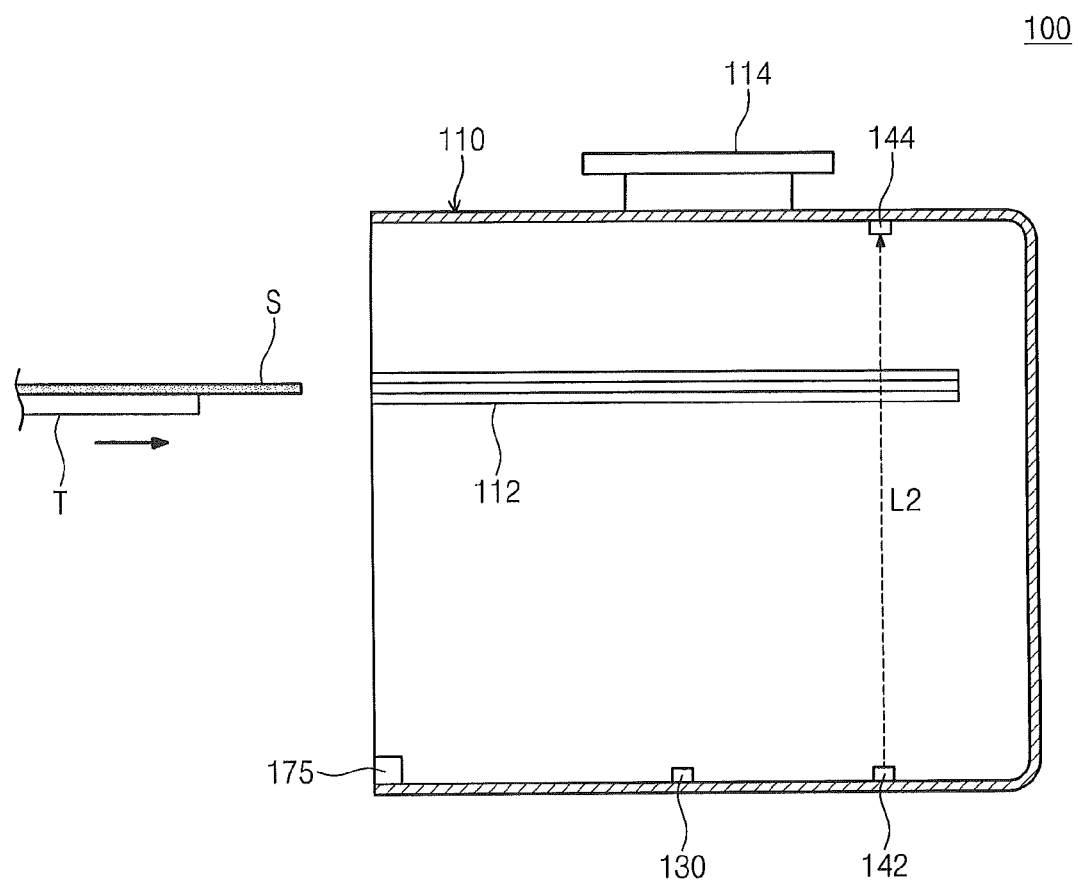
FIGS. 8 through 10 illustrate exemplary operations in accordance with the measuring method of FIG. 6.
Figure 9:
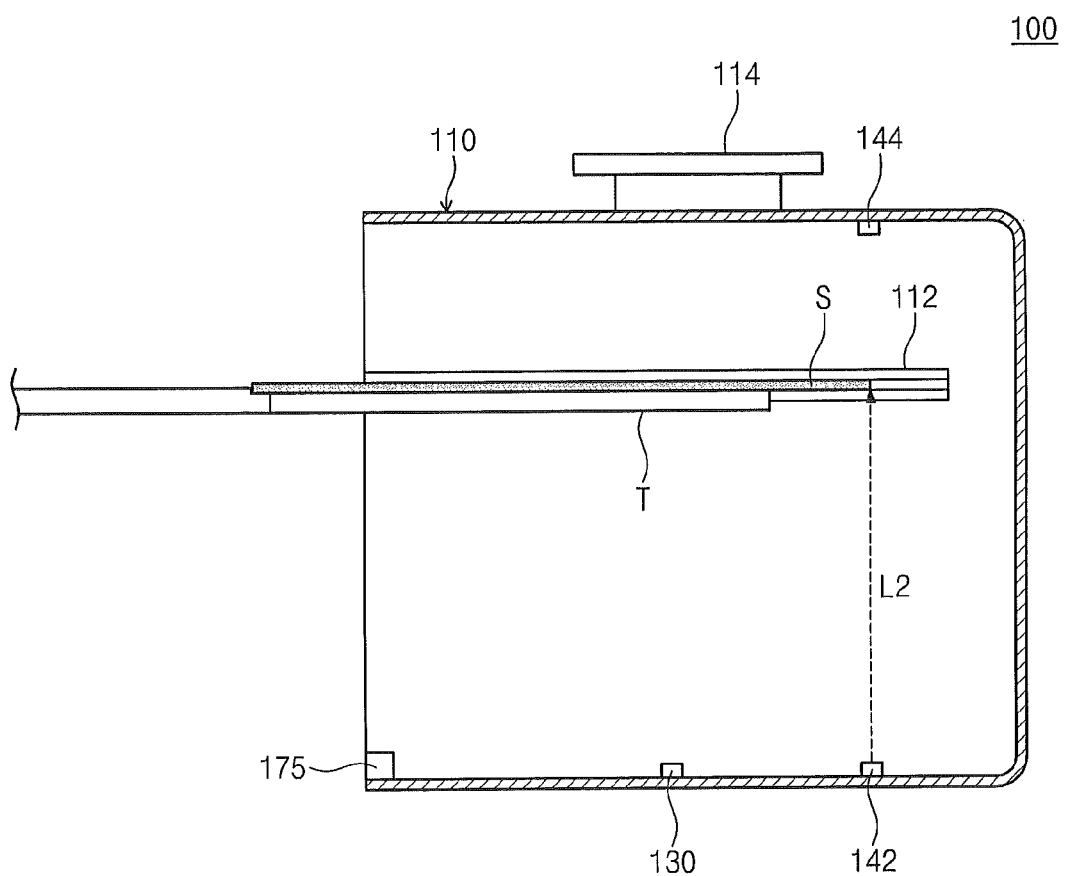
Figure 10:
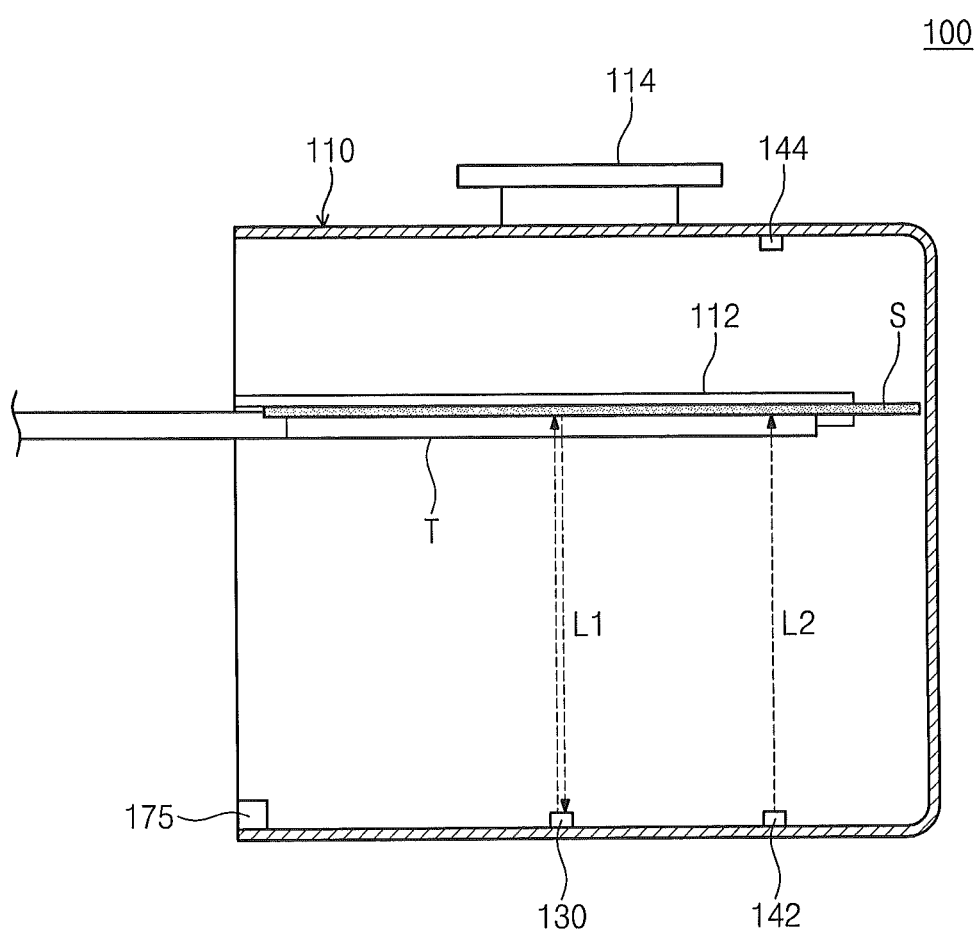

FIGS. 8 through 10 are operation views in accordance with the measuring method of FIG. 6.

If the housing 110 is open, a substrate S may be carried in the housing 110 (Block S140). The substrate S may be carried in the housing 110 by a transfer robot T. The transfer robot T may carry in the substrate S to a place or position such that carry-in of the substrate is completed (e.g., the substrate S is fully carried or transferred into the housing 110).

As the substrate S is carried in the housing 110, a horizontal displacement may be measured (Block S150).

Referring to FIG. 8, before the substrate S is carried in the housing 110, the second light output part 142 may output second light L2 such that the second light receiving part 144 receives the second light L2. If the second light receiving part 144 receives the second light L2, a sensing signal may be generated and the controller 150 may receive the sensing signal to determine that the substrate S does not yet pass through (e.g., extend into) a path of the second light L2.

Referring to FIG. 9, as the substrate S is carried in the housing 110, the substrate S passes through (e.g., extends into or interferes with) a path of the second light L2 and thereby the second light L2 is blocked. Once the second light L2 is blocked, the second light receiving part 144 senses that reception of the second light L2 output from the second light output part 142 is stopped to generate a stop signal. The controller 150 receives the stop signal and may determine or obtain the time at which the substrate S passes through a point or to a position at which the horizontal displacement sensor 140 is disposed (e.g., a vertical axis defined between corresponding parts 142, 144).

As the substrate S is carried in the housing 110, the substrate S passes through a point in which the vertical displacement sensor 130 is disposed. Thus, the first light output part 132 outputs first light L1 and the first light L1 is reflected from the substrate S and thereby the first light receiving part 134 receives the first light L1. In some embodiments, the first light receiving part 134 can sense a phase difference of the received first light L1. As the substrate S is carried in the housing 110, a phase difference of the first light L1 which the first light receiving part 134 receives is being changed (e.g., by a minute step difference of a bottom surface of the substrate S or compositional or structural differences thereof). This change in phase difference may be sensed (e.g., continuously sensed).

Referring to FIG. 10, if carry-in of the substrate S is complete, the transfer robot T is stopped and thereby movement of the substrate S is stopped. At this time, a phase difference of the first light L1 sensed by the first light receiving part 134 remains constant and the controller 150 receives an accompanying signal. The controller 150 may determine that carry-in of the substrate S is complete if a phase difference of the first light L1 sensed from the first light receiving part 134 remains constant.

Thus, the controller 150 can determine or obtain a time when the substrate passes through a path of the second light L2 and the time when carry-in of the substrate is completed and thereby a horizontal displacement of the substrate S can be calculated.

Figure 11:
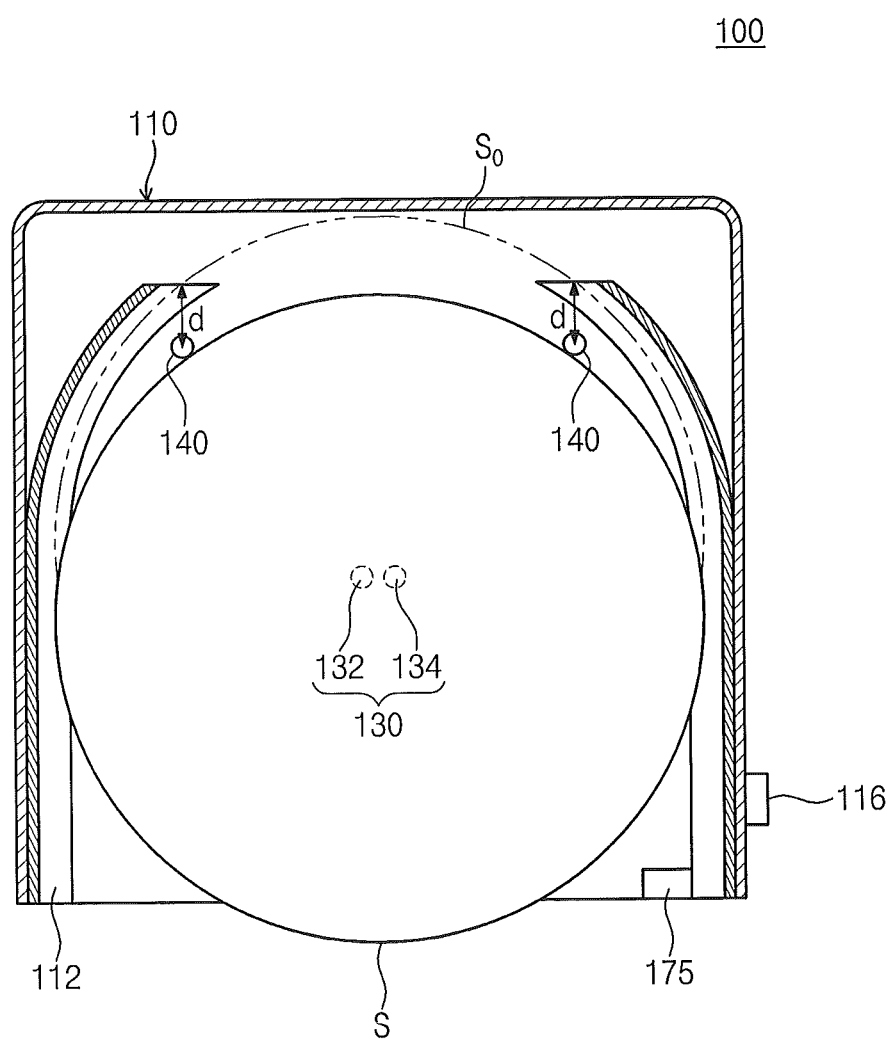
FIGS. 11 and 12 illustrate exemplary operations including a method of calculating a two dimensional horizontal displacement in the measuring method of FIG. 6.
Figure 12:
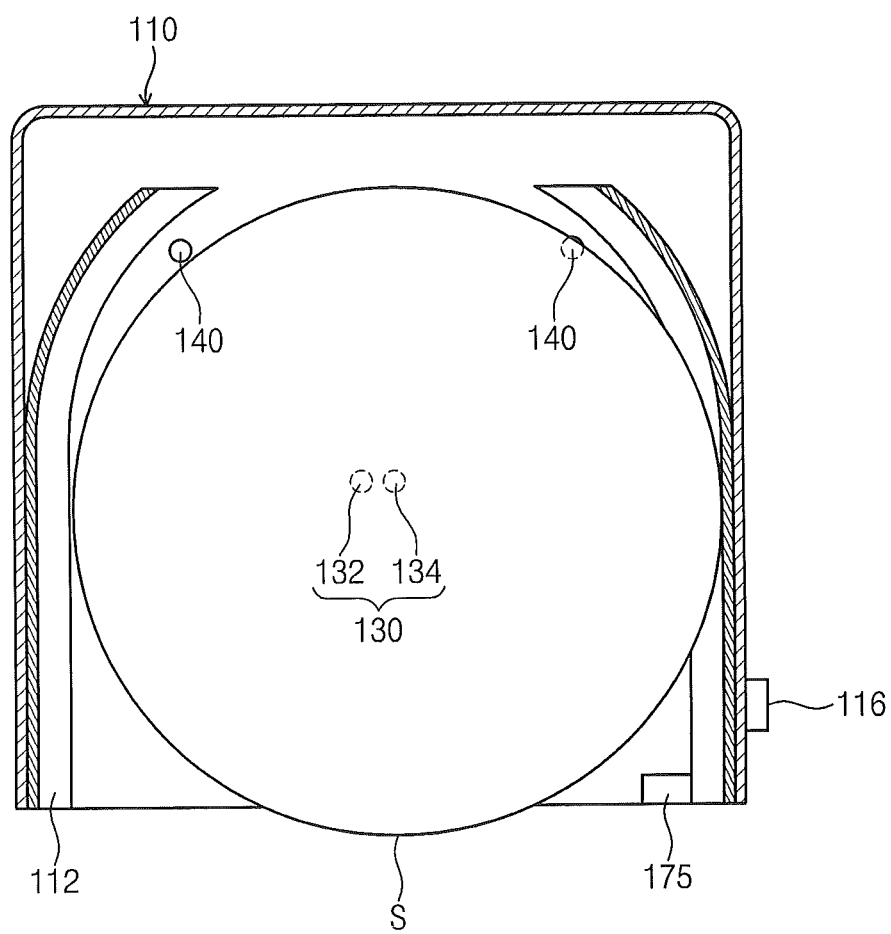

Since the horizontal displacement may have a two dimensional value, a plurality of horizontal displacement sensors 140 may be provided for calculating the horizontal displacement value. FIGS. 11 and 12 are drawings illustrating a method of calculating a two dimensional horizontal displacement in the measuring method of FIG. 6.

Referring to FIGS. 11 and 12, two horizontal displacement sensors 140 are disposed on (e.g., aligned with or directed toward) an edge of the substrate S which is carried in an exact or a desired position. Each horizontal displacement sensor 140 may be disposed while forming a predetermined angle at the same distance from the center of the substrate which is carried in an exact position. Each horizontal displacement sensor 140 may be disposed to be substantially equidistant or equidistant from the center of the subtracted that has been carried to the exact or desired position.

Referring to FIG. 11, the substrate S can block out the second light of the two horizontal displacement sensors 140 at the same time while being carried in the housing 110. Accordingly, each of the plurality of second light receiving parts 144 senses at the same time that the second light is blocked out and the controller 150 can determine that a displacement error of the substrate S does not exist in a left and right (or horizontal) direction based on a carry-in path direction of the substrate S. Also, the two second light receiving parts 144 can sense that the second light is blocked out for a same time while the substrate S moves a distance d from a place at which the substrate S begins to block out the second light to a place $S_0$ at which carry-in of the substrate S is completed and the substrate S is stopped.

Referring to FIG. 12, as illustrated, the substrate S first blocks out the second light being received to the second light receiving part 144 located on the right based on a carry-in path direction of the substrate S as it is being carried in the housing 110. In this state, the second light being received by the second light receiving part 144 located on the left is not blocked out. The right second light receiving part 144 transmits a stop signal to the controller 150 and the left second light receiving part 144 transmits a sensing signal to the controller 150. Accordingly, the controller 150 can determine that the substrate S is carried in too far to the right. The controller 150 can calculate an eccentric distance or measure of carry-in of the substrate S by comparing the time when the right second light is blocked out with the time when the left second light is blocked out.

Once carry-in of the substrate S is completed, the vertical displacement sensor 130 can measure a vertical displacement (Block S160 in FIG. 6). The first light output part 132 outputs the first light to a bottom surface of the substrate S of which carry-in is completed and the first light receiving part 134 receives the first light reflected from the substrate. The first light receiving part 134 may sense a phase of the reflected first light and the controller 150 can calculate a vertical displacement of the substrate on the basis of a phase difference between the first light of the time when it is output (e.g., not reflected) and the first light of the time when it is reflected.

With reference to Blocks S150 and S160 in FIG. 6, the controller 150 can calculate a vertical displacement and a horizontal displacement of carry-in of the substrate S. The controller 150 can calculate a carry-in error of the substrate S by comparing the calculated vertical displacement and the calculated horizontal displacement with a coordinate value reflecting a predetermined exact or desired carry-in position of the substrate S. The desired or exact position may be stored in the memory 155 in advance. The controller 150 may store the calculated carry-in error in the memory 155.

After carrying out the substrate, if repeatedly performing S140, S150 and S160, a plurality of carry-in errors can be obtained. For example, one hundred carry-in errors can be obtained by repeatedly performing a carry-in of the substrate, calculation of carry-in position (or error) and a carry-out of the substrate one hundred times. Using this, the degree of occurrence of errors when a transfer robot carries in the substrate and tendency of errors generated in the process of repeating it can be judged.

Figure 13:
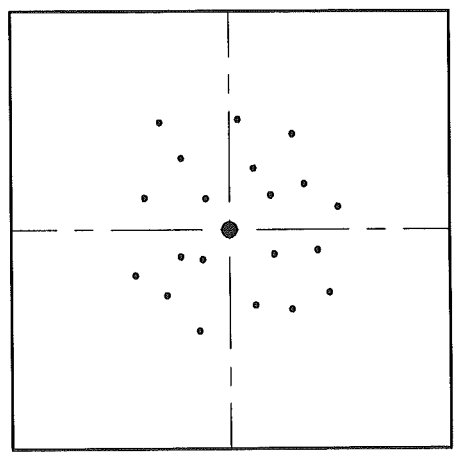
FIG. 13 is a graph showing an exemplary carry-in error measured according to the measuring method of FIG. 6.

FIG. 13 is a graph showing a carry-in error measured according to the measuring method of FIG. 6.

In FIG. 13, a carry-in error is measured twenty times. Although a vertical displacement is not expressed, the vertical displacement may be expressed using a three dimensional graph. Referring to FIG. 13, the center of the graph represents a carry-in exact position. Each point represents a displacement or carry-in error. If measuring a carry-in error several times, trends with respect to the exact position may be determined and observed and it is possible to understand the degree of life deterioration of the transfer robot.

According to embodiments of the inventive concept, the degree of precision of carry-in of the substrate can be measured.

According to embodiments of the inventive concept, using a FOUP type measuring device, the degree of precision of carry-in of the substrate can be measured using existing semiconductor equipment.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A measuring device comprising:
    a housing having an opening configured to receive a substrate that is carried in the housing along a carry-in path, the opening being disposed on one side of the housing;
    a first sensor disposed on an inner surface of the housing, the first sensor including a first light output part configured to emit a first light to the substrate and a first light receiving part configured to sense the first light reflected from the substrate;
    a second sensor including at least one second light output part configured to emit a second light and at least one second light receiving part configured to sense the second light, wherein the at least one second light output part and the at least one second light receiving part are disposed on opposite inner surfaces of the housing with the carry-in path of the substrate disposed between them such that the second light is blocked from the at least one second light receiving part by the substrate; and
    a controller, wherein, when a substrate is carried in the housing, the controller is configured to: calculate a vertical displacement of the substrate using the first light reflected from the substrate, to calculate a horizontal displacement of the substrate using the second light blocked by the substrate, and to calculate a displacement error based upon the time when the substrate blocks the second light to the time when the substrate is at a predetermined desired carry-in position of the substrate, wherein the displacement error is calculated using the vertical displacement and the horizontal displacement.

2. The measuring device of claim 1, wherein the first light output part and the at least one second light output part are disposed on a bottom surface of the housing to emit light to a bottom, non-pattern surface of the substrate.

3. The measuring device of claim 1, wherein the at least one second light output part and the at least one second light receiving part are disposed away from the opening and are directed toward an edge of a substrate that has been carried in the housing to the predetermined desired carry-in position.

4. The measuring device of claim 3, wherein the at least one second light output part comprises a plurality of second light output parts and the at least one second light receiving part comprises a plurality of corresponding second light receiving parts, and wherein the plurality of second light output parts are each disposed substantially equidistant from a center of a substrate that has been carried in the housing to the predetermined desired carry-in position and the plurality of second light receiving parts are each disposed substantially equidistant from a center of a substrate that has been carried in the housing to the predetermined desired carry-in position.

5. The measuring device of claim 1, further comprising:
    a battery configured to supply power to the first sensor, the second sensor and the controller;
    a door and positionable to open and close the opening;
    a third sensor configured to sense whether the door is positioned such that the opening is open or closed; and
    a switch configured to control supply of the power based on a signal from of the third sensor.

6. The measuring device of claim 1, further comprising:
    a battery configured to supply power to the first sensor, the second sensor and the controller;
    a third sensor which is installed on a bottom surface of the housing and is configured to sense if the housing is located on a load port; and
    a switch configured to control supply of the power based on a signal from of the third sensor.

7. The measuring device of claim 1, further comprising a communication module configured to communicate with an external device,
    wherein the controller is configured to transmit the displacement error via the communication module.

8. The measuring device of claim 1, wherein the housing is shaped and configured to be compatible with a front opening unified pod (FOUP).

* * * * *